US012645427B2

(12) United States Patent
Hershman et al.

(10) Patent No.: US 12,645,427 B2
(45) Date of Patent: Jun. 2, 2026

(54) STARVATION-VOLTAGE BASED RANDOM NUMBER GENERATOR

(71) Applicant: Nuvoton Technology Corporation, Hsin-chu (TW)

(72) Inventors: Ziv Hershman, Givat Shmuel (IL); Tamir Golan, Kibbutz Givat-Chaim Meuchad (IL)

(73) Assignee: Nuvoton Technology Corp., Hsinchu (TW)

( * ) Notice: Subject to any disclaimer, the term of this patent is extended or adjusted under 35 U.S.C. 154(b) by 1053 days.

(21) Appl. No.: 17/571,549

(22) Filed: Jan. 10, 2022

(65) Prior Publication Data

US 2023/0221926 A1     Jul. 13, 2023

(51) Int. Cl.
*G06F 7/58*          (2006.01)
*H03K 3/84*          (2006.01)

(52) U.S. Cl.
CPC ............... *G06F 7/58* (2013.01); *G06F 7/588* (2013.01); *H03K 3/84* (2013.01)

(58) Field of Classification Search
CPC .............. G06F 7/58; G06F 7/588; H03K 3/84
See application file for complete search history.

(56) References Cited

U.S. PATENT DOCUMENTS

| | | | |
|---|---|---|---|
| 4,161,041 A | 7/1979 | Butler et al. | |
| 4,905,176 A | 2/1990 | Schulz | |
| 5,251,165 A | 10/1993 | James, III | |

| | | | |
|---|---|---|---|
| 6,617,936 B2 | 9/2003 | Dally et al. | |
| 6,763,363 B1 | 7/2004 | Driscoll | |
| 6,792,438 B1 | 9/2004 | Wells et al. | |
| 7,117,233 B2 | 10/2006 | Dichtl | |
| 7,161,970 B2 | 1/2007 | Lim et al. | |
| 7,269,614 B2 | 9/2007 | Wells et al. | |
| 8,024,386 B2 | 9/2011 | Song et al. | |
| 8,150,900 B2 | 4/2012 | Golic | |

(Continued)

FOREIGN PATENT DOCUMENTS

| | | | | |
|---|---|---|---|---|
| CN | 107506174 A | * | 12/2017 | ............. G06F 7/588 |
| CN | 110795063 A | | 2/2020 | |

(Continued)

OTHER PUBLICATIONS

A Ring Oscillator Based Truly Random Number Generator, University of Waterloo, Stewart Robson, 2013 (Year: 2013).*

(Continued)

*Primary Examiner* — Emily E Larocque
*Assistant Examiner* — Jerome Anthony Klosterman, II
(74) *Attorney, Agent, or Firm* — Meitar Patents LTD.; Daniel Kliger

(57)          ABSTRACT

An integrated circuit includes signal-source circuitry (SSC), an SSC power supply circuit (SSC-PS) and a digitization circuit. The SSC is configured to generate an output signal, which is guaranteed to meet specified electrical parameters provided that a supply voltage to the SSC is within a specified operating voltage range. The SSC-PS is configured to power the SSC with a reduced voltage that is below the specified operating voltage range, thereby causing the output signal to be noisy. The digitization circuit is configured to digitize the noisy output signal so as to generate a respective sequence of random numbers.

14 Claims, 5 Drawing Sheets

(56) References Cited

U.S. PATENT DOCUMENTS

| | | | |
|---|---|---|---|
| 8,489,660 | B2 | 7/2013 | Herbert et al. |
| 8,583,713 | B2 | 11/2013 | Sugimoto et al. |
| 9,189,202 | B2 | 11/2015 | Burleson et al. |
| 9,356,582 | B2 | 5/2016 | Lee et al. |
| 9,531,354 | B1 | 12/2016 | Sim |
| 9,696,965 | B2 | 7/2017 | Alon |
| 9,774,317 | B1 | 9/2017 | Diamant et al. |
| 10,824,396 | B2 | 11/2020 | Hershman |
| 10,878,133 | B2 | 12/2020 | Hershman |
| 11,188,306 | B1 | 11/2021 | Kirschner et al. |
| 2005/0097153 | A1 | 5/2005 | Dirscherl et al. |
| 2008/0091755 | A1 | 4/2008 | Mudge et al. |
| 2009/0106339 | A1 | 4/2009 | Vasyltsov et al. |
| 2009/0248771 | A1 | 10/2009 | Vergnes et al. |
| 2012/0221616 | A1 | 8/2012 | Yasuda et al. |
| 2013/0013657 | A1 | 1/2013 | Emelko et al. |
| 2013/0093502 | A1 | 4/2013 | Kim et al. |
| 2014/0344321 | A1 | 11/2014 | Hamilton et al. |
| 2015/0149790 | A1 | 5/2015 | Li |
| 2015/0154006 | A1* | 6/2015 | Yang ........................ G06F 7/588 708/251 |
| 2015/0199176 | A1* | 7/2015 | Idgunji ..................... G06F 1/26 708/251 |
| 2015/0372685 | A1 | 12/2015 | Kitagawa |
| 2018/0143806 | A1 | 5/2018 | Park et al. |
| 2020/0042289 | A1 | 2/2020 | Wang et al. |
| 2021/0409008 | A1 | 12/2021 | Wu |
| 2022/0247395 | A1 | 8/2022 | Alon |
| 2023/0179411 | A1* | 6/2023 | Van Loon ............... G06F 7/588 380/46 |

FOREIGN PATENT DOCUMENTS

| | | | |
|---|---|---|---|
| DE | 19921852 | A1 | 11/2000 |
| DE | 102014219795 | A1 | 3/2016 |
| JP | 2567681 | B2 | 12/1996 |
| JP | 2010117846 | A | 5/2010 |
| WO | WO-2022027325 | A1 * | 2/2022 |

OTHER PUBLICATIONS

Y. Cao, C.-H. Chang, Y. Zheng and X. Zhao, "An energy-efficient true random number generator based on current starved ring oscillators," 2017 Asian Hardware Oriented Security and Trust Symposium (AsianHOST), Beijing, China, 2017, pp. 37-42 (Year: 2017).*
Rivera, C., Vo, A. V., Maldonado, A., Gomez, A., & Nguyen, K. (2018). CSUN. http://www.csun.edu/~jaf35230/ECE493_VCO_Report_Official.pdf (Year: 2018).*
Carter, "Designing Gain and Offset in Thirty Seconds," Application Report SLOA097, Texas Instruments, pp. 1-15, Feb. 2002.
Ben Romdhane, "Modeling, Design and Characterization of Delay-Chains Based True Random Number Generator," Doctoral Thesis, Micro and Nanotechnologies/Microelectronics, Télécom ParisTech, pp. 1-181, year 2014.
Ranasinghe et al., "Random Numbers from Metastability and Thermal Noise," Electronics Letters, vol. 41, issue 16, pp. 891-893, Aug. 4, 2005.

Dichtl et al., "High-Speed True Number Generation with Logic Gates Only," Proceedings of the International Workshop on Cryptographic Hardware and Embedded Systems, pp. 45-62, year 2007.
Hata et al., "FPGA Implementation of Metastability-Based True Random Number Generator," IEICE Transactions on Information and Systems, vol. E95-D, issue 2, pp. 426-436, Feb. 2012.
Torii et al., "ASIC implementation of random number generators using SR latches and its evaluation," EURASIP Journal on Information Security, pp. 1-12, year 2016.
Ben-Romdhane et al., "Stochastic Model of a Metastability-Based True Random Number Generator," International Conference on Trust and Trustworthy Computing, pp. 92-105, year 2013.
Majzoobi et al., "FPGA-based True Random Number Generation using Circuit Metastability with Adaptive Feedback Control," International Workshop on Cryptographic Hardware and Embedded Systems—CHES 2011, pp. 17-32, year 2011.
Hars., "Random Number Generation Based on Oscillatory Metastability in Ring Circuits", Cryptology ePrint Archive, Issue 2011/637, pp. 1-15, Nov. 26, 2011.
Kim et al., "Nano-Intrinsic True Random Number Generation," arXiv:1701.06020v1 [cs.ET], pp. 1-9, Jan. 21, 2017.
Barangi et al., "Straintronics-Based True Random Number Generator for High-Speed and Energy-Limited Applications," IEEE Transactions on Magnetics, vol. 52, No. 1, pp. 1-9, Jan. 2016.
Kinniment et al., "Design of an On-Chip Random Number Generator using Metastability," Proceedings of the 28th European Solid-State Circuits Conference, pp. 1-4, Sep. 24-26, 2002.
Srinivasan et al., "2.4 GHz 7mW All-Digital PVT-Variation Tolerant True Random Number Generator in 45nm CMOS," Symposium on VLSI Circuits/Technical Digest of Technical Papers, pp. 203-204, Jul. 2010.
Mathew et al., "2.4 Gbps, 7 mW All-Digital PVT-Variation Tolerant True Random Number Generator for 45 nm CMOS High-Performance Microprocessors," IEEE Journal of Solid-State Circuits, vol. 47, issue 11, pp. 2807-2821, Nov. 2012.
Hamburg et al., "Analysis of Intel's Ivy Bridge Random Number Generator," Cryptography Research, Inc., pp. 1-22, Mar. 2012.
Tokunaga et al., "True Random Number Generator With a Metastability-Based Quality Control," IEEE Journal of Solid-State Circuits, vol. 43, No. 1, pp. 78-85, Jan. 2008.
Alon, U.S. Appl. No. 17/166,012, filed Feb. 3, 2021.
U.S. Appl. No. 17/166,012 Office Action dated Sep. 9, 2022.
Pankratz et al, "Multiloop High-Power-Supply-Rejection Quadrature Ring Oscillator", Sep. 2012, IEEE Journal of Solid-State Circuits, vol. 47, No. 9, pp. 2033-2048 (Year: 2012).
Liu et al, "A Low-Cost Low-Power Ring Oscillator-Based Truly Random Number Generator for Encryption on Smart Cards", Jun. 2016, IEEE Transactions on Circuits and Systems II: Express Briefs, vol. 63, No. 6, pp. 608-612 (Year: 2016).
Günay et al, "IC Random Number Generator Exploiting Two Simultaneous Metastable Events of Tetrahedral Oscillators ", Sep. 2020, IEEE Transactions on Circuits and Systems II: Express Briefs, vol. 67, No. 9, pp. 1634-1638 (Year: 2020).
Smith et al, "Analysis and Design of a Tetrahedral Oscillator," Jan. 2022, IEEE Transactions on Circuits and Systems II: Express Briefs, vol. 69, No. 1, pp. 75-79 (Year: 2022).
Non-Final Office Action, U.S. Appl. No. 17/892,173, dated Mar. 9, 2026.
Notice of References Cited, U.S. Appl. No. 17/892,173, dated Mar. 9, 2026.

* cited by examiner

*300*

Vdd (starvation voltage)

302    302    ...    302

To Digitization Circuit

Vss

*400*

402

406

408

PULSE

404

Closed Loop

Vdd (starvation voltage)

300

302    302    ...    302

To Digitization Circuit

Vss

700

702 — SET SSC VDD TO STARVATION VOLTAGE

704 — RANDOM NUMBER REQUEST?

NO

YES

706 — WAIT FOR A PRESET TIME INTERVAL

708 — SAMPLE NEXT RANDOM NUMBER BIT

710 — ALL RANDOM-NUMBER BITS SAMPLED?

YES

NO

STARVATION-VOLTAGE BASED RANDOM NUMBER GENERATOR

FIELD OF THE INVENTION

The present invention relates to integrated circuits, and particularly to methods and apparatuses for hardware generation of random numbers.

BACKGROUND OF THE INVENTION

In digital systems, generation of random numbers is often required, for example, in the generation of security keys.

For example, U.S. Pat. No. 9,531,354 describes a random number generator; in some embodiments, the random number generator comprises two cross-coupled inverter chains, wherein each inverter chain comprises an odd number of gates including an input NAND gate; wherein when a clock signal input into the NAND gate of both inverter chains switches from low to high, the inverter chains start toggling until a noise induced phase difference automatically collapses the toggling after a random number of cycles; and wherein a random number generated by the random number generator is based on the random number of cycles.

U.S. Pat. No. 6,792,438 describes a random number generator comprising random number generation circuitry to generate and output random bits. The random number generator includes interface circuitry to receive and store random bits output by the random number generation circuitry and to output random bits. The interface circuitry prevents outputting the same random bits more than once.

Lastly, U.S. Pat. No. 8,583,713 describes a physical random number generation device including a physical random number generation source which generates a white noise, an AD conversion module which inputs the white noise for conversion to a physical prime random number as digital data, a physical prime random number sequence generation module which inputs two or more physical prime random numbers to generate a physical prime random number sequence, a white noise array, generation module for inputting the physical prime random number sequence and for generating a white noise array, a white noise composition module for generating multiple physical random numbers from the input white noise array, and an interface for externally outputting the generated physical random numbers as physical random number data. With this arrangement, multiple physical random numbers are generated at high speeds from the physical prime random number(s) taken out of the physical random number generation source as digital data.

SUMMARY OF THE INVENTION

An embodiment of the present invention that is described herein provides an integrated circuit including signal-source circuitry (SSC), an SSC power supply circuit (SSC-PS) and a digitization circuit. The SSC is configured to generate an output signal, which is guaranteed to meet specified electrical parameters provided that a supply voltage to the SSC is within a specified operating voltage range. The SSC-PS is configured to power the SSC with a reduced voltage that is below the specified operating voltage range, thereby causing the output signal to be noisy. The digitization circuit is configured to digitize the noisy output signal so as to generate a respective sequence of random numbers.

In some embodiments, the SSC-PS is configured to set the reduced voltage to meet a specified logical functionality of the SSC but to fail meeting one or more electrical parameter specifications of the SSC. In an embodiment, the SSC-PS is configured to connect the SSC power supply to a fixed reduced voltage. In a disclosed embodiment, the SSC-PS is configured to calibrate the reduced voltage.

In some embodiments, the SSC is an oscillator. In an embodiment, the SSC-PS includes a closed-loop circuit that is configured to adjust the reduced voltage so as to decrease the difference between an oscillation frequency of the oscillator and a preset frequency. In an example embodiment, the SSC includes a chain of at least two buffers. In a disclosed embodiment, the SSC is implemented using one or more logic cells that are drawn from a library, and the reduced voltage is below the operating voltage range specified for the library.

There is additionally provided, in accordance with an embodiment of the present invention, a method including, using signal-source circuitry (SSC), generating an output signal, which is guaranteed to meet specified electrical parameters provided that a supply voltage to the SSC is within a specified operating voltage range. The SSC is powered with a reduced voltage that is below the specified operating voltage range, thereby causing the output signal to be noisy. The noisy output signal is digitized so as to generate a respective sequence of random numbers.

The present invention will be more fully understood from the following detailed description of the embodiments thereof, taken together with the drawings in which:

US 12,645,427 B2

Figure 6A:
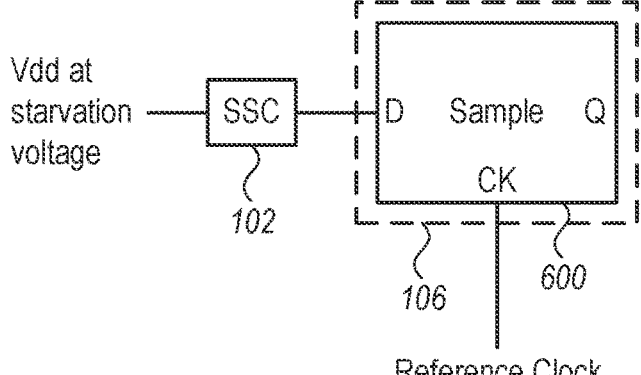
Figure 6B:
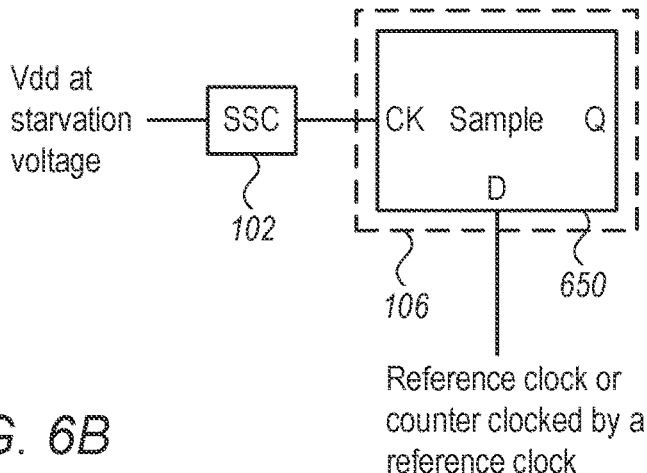
Figure 7:
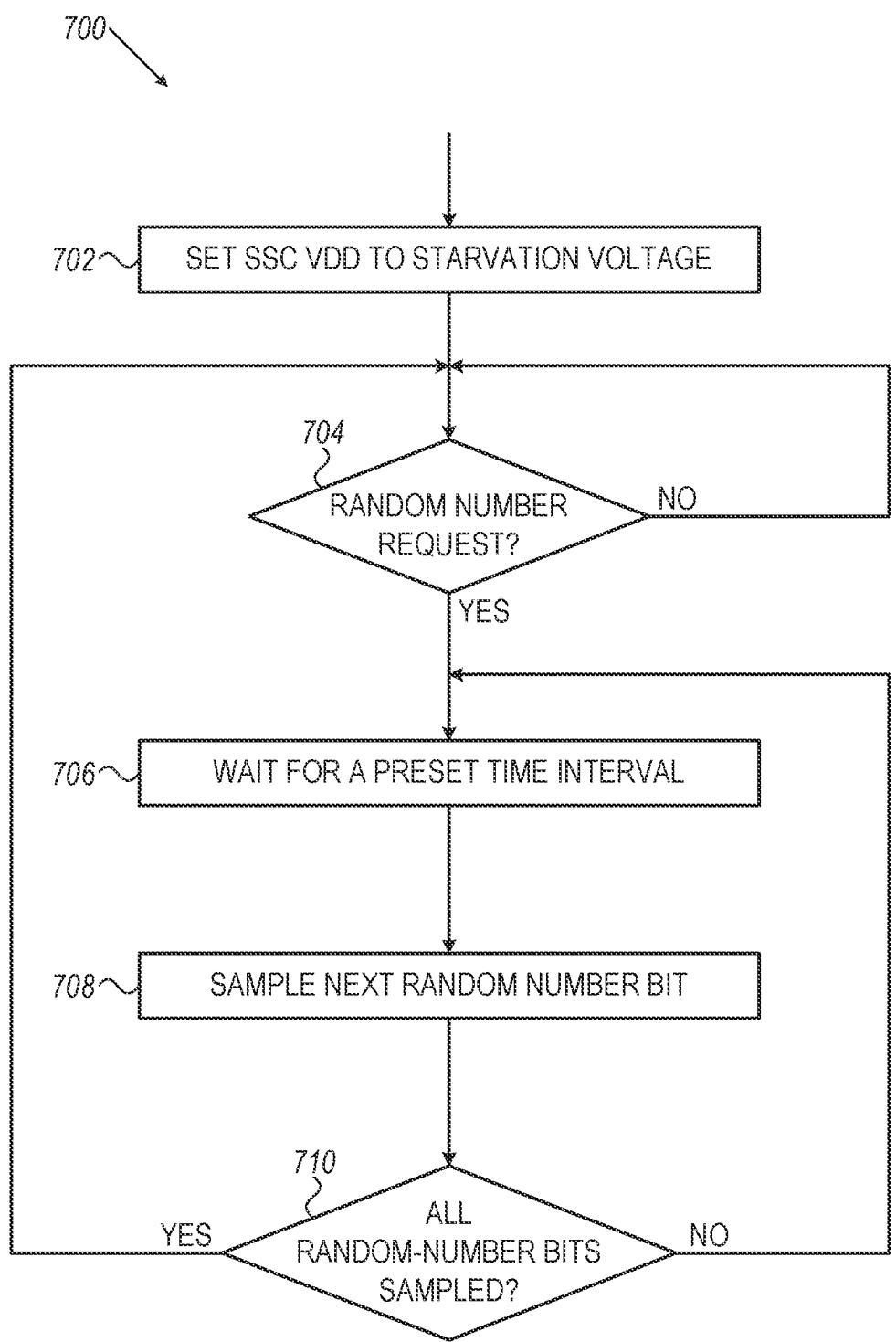

3 circuit, wherein the SSC is a multi-stage buffer, in accordance with an embodiment of the present invention;

FIG. 6A is a block diagram that schematically illustrates circuitry for random number generation wherein the digitization circuit samples the SSC output responsively to edges in a clock source, in accordance with an embodiment of the present invention;

FIG. 6B is a block diagram that schematically illustrates circuitry for random number generation wherein the digitization circuit samples a reference clock or a counter that is clocked by a reference clock, responsively to edges in the SSC output, in accordance with an embodiment of the present invention; and FIG. 7 is a flow chart that schematically illustrates a method for generating random numbers in an integrated circuit, in accordance with an embodiment of the present invention.

DETAILED DESCRIPTION OF EMBODIMENTS

Overview

Random numbers are useful in a wide variety of applications, such as security and statistical computations. Often, pseudo-random numbers can be used, such as those generated by a linear-feedback-shift-register; however, in applications like security, such random numbers are sometimes considered a security hazard, and random numbers that are generated by physical phenomena (e.g., thermal noise), are preferred.

In electrical circuits, thermal noise is generated by electronic components that operate at any temperature greater than absolute-zero; such noise, however, may be weak, and the generation of random numbers from the thermal noise may be tricky.

Embodiments of the present invention that are disclosed herein provide for improved circuits and methods for the generation of random numbers. The disclosed embodiments utilize a signal source circuit (SSC) that operates at a "starvation" power-supply voltage. Generally, when logic gates operate at a supply voltage that is below a certain threshold, the gate may still perform its designated logic function (e.g., an inverter will still invert the input logic level) but is not guaranteed to meet one or more of its specified electrical parameters (e.g., the propagation delay of the gate may be above a maximum specifications). When a gate is in such low operating voltage, the variations in the propagation delay due to the thermal noise increase.

In the present context, the term "starvation power-supply voltage" means a power-supply voltage with which a digital logic circuit performs at least some aspects of its designated logic functionality correctly, but is not guaranteed to perform all its designated logic functionality, or to meet one or more of its specified electrical parameters; a circuit with power supply at the starvation voltage will be referred to as a circuit "in starvation".

The delays that circuits in starvation produce are not random, as they have a bias and a distribution around the bias; however, within a limited timing window that is substantially lower than the distribution variance, the delay values have high entropy and may be considered random.

In embodiments, the random number generation circuit comprises, in addition to the SSC that is operating at starvation power-supply voltage, a signal-source-power-supply (SSC-PS) that generates the starvation-voltage supply for the SSC, and a digitization circuit that samples the output of the SSC and generates random numbers. (In the context of the present disclosure, digitization circuits usually comprise samplers. We will sometimes refer to "digitization circuit" and "samplers" interchangeably.)

In some embodiments, the SSC comprises a ring oscillator; the oscillation frequency of the ring oscillator varies, and, if the ring oscillator is in starvation, the variations of the cycle time have high entropy and may be used to generate random numbers. In other embodiments, the SSC comprises a multi-gate buffer, which, when in starvation, adds a high-entropy delay to input edges.

In an embodiment, the SSC-PS connects the power supply of the SSC to a fixed starvation-voltage source; in some embodiments the starvation voltage may be calibrated. In other embodiments, the SSC-PS comprises an analog multiplier that multiples a reference voltage by a constant to generate the starvation voltage.

In yet other embodiments, the SSC-PS comprises a self-calibrating circuit that multiplies the threshold voltage (Vth) of the SSC's transistors by a constant. In some embodiments the SSC-PS adds a bias voltage to Vth to generate the starvation voltage.

In an embodiment, the SSC is a ring-oscillator, and the SSC-PS controls the ring oscillator supply voltage indirectly, by setting the frequency of the ring oscillator to a frequency that corresponds to a power supply at starvation voltage.

In embodiments, the SSC comprises a multi-stage buffer that buffers a clock source. The delay in the buffer is significantly larger than the cycle time of the clock and hence, if the output of the buffer is sampled with the same clock source, and if the buffer is in starvation, the sampling will yield a series of values which may be considered random.

Lastly, we disclose two sampler-circuit variants. In one embodiment the sampler samples the output of the SSC with a separate clock source; in another embodiment, the output of the SSC is used as a clock input to a sampler that samples a separate clock.

Thus, in embodiments, random numbers may be generated by sampling a starved buffer or a starved ring oscillator.

System Description

The basic building blocks of a Metal-Oxide-Silicon (MOS) integrated circuit are N-MOS and P-MOS transistors. In most cases, however, designers of digital integrated circuits use an off-the-shelf library of basic logic cells such as inverters and gates, wherein each logic cell comprises a plurality of interconnected transistors. The library of basic cells is typically characterized, for any given integrated circuit process technology, to specify a set of electrical parameters and respective operating conditions. The parameters and operating conditions are provided (typically by the silicon manufacturer) to the designers. A typical set of electrical parameters includes (among others), a minimum and a maximum value for the propagation delay of cells with predefined loads; a typical set of operating conditions includes a power-supply range (e.g., minimum and maximum Vdd) in which the propagation delay is more than the minimum and less than the maximum propagation delay parameters.

When the operating conditions of the cell are not within the specified operating conditions limits, the cell sometimes continues to be logically functional (e.g., an inverter will still invert its input reliably), but may not meet the specified minimum or maximum electrical parameters. For example, if the supply voltage (Vdd) is set to a level that is slightly lower than the minimum value specified in the operation
conditions, the cell will typically function, but the propaga-
tion delay may be slower than the specified minimum.

When the Vdd is further reduced, the propagation delay
typically increases, until the Vdd reaches a point where the
cell loses functionality.

The variations in propagation delay as a result of thermal
and flicker noise grow when Vdd decreases, mainly because
slow rise and fall times enable the accumulation of substan-
tial noise.

In embodiments according to the present invention, the
power supply of cells is set to supply a voltage which is
substantially lower than the specified cell library voltage, for
which the timing behavior of the cells is less predictable, but
the voltage is sufficiently high to guarantee the logical
functionality that the cells. When operating at this voltage,
cells will be noisy and, subsequently, the cell propagation
delay will exhibit high entropy. We will refer to such Vdd
operating voltage as a Starvation Operating voltage (or,
sometimes, "starvation voltage"); we will refer to cells with
Vdd at the starvation operating voltage as cells in starvation.
A starvation operating voltage may be chosen from a range
of voltage values, referred to as "starvation range" below.
When a series of pulses is input to a cell at starvation, the
propagation delay values contain a large random compo-
nent; the accumulated delay of a plurality of cells may be
used to generate a high-entropy series of random numbers.

Figure 1:
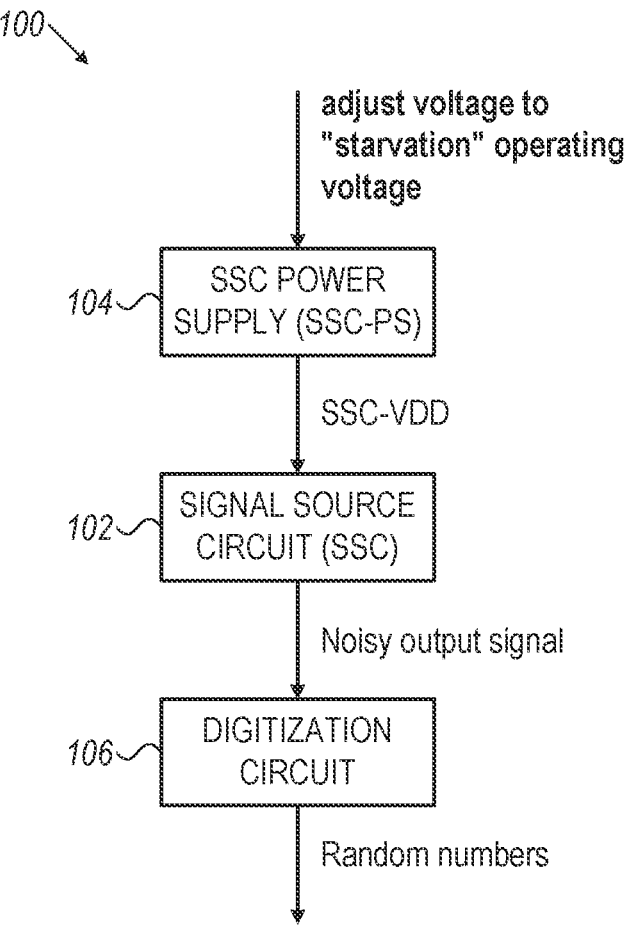
FIG. 1 is a block diagram that schematically illustrates circuitry for random number generation in an integrated circuit, in accordance with an embodiment of the present invention.

FIG. 1 is a block diagram that schematically illustrates
circuitry 100 for random number generation in an integrated
circuit, in accordance with an embodiment of the present
invention. Circuitry 100 may be embedded in an integrated
circuit, such as an application specific integrated circuit
(ASIC) or a field-programmable gate-array (FPGA).

Circuitry 100 comprises a Noise Source Circuit (SSC)
102, an SSC power supply (SSC-PS) 104 and a digitization
circuit 106. SSC 102 comprises one or more logic cells, and
receives a power supply at the starvation voltage. In some
embodiments SSC 102 may be a free-running oscillator; in
other embodiments SSC 102 may be a multi-stage buffer
that receives the output of an oscillator (not shown) as an
input.

SSC-PS 104 is a voltage source that is configured to
output a starvation-voltage power input to SSC 102. Con-
figurations of SSC-PC 104 according to a variety of example
embodiments will be described below, with reference to
FIGS. 2A through 2E.

Digitization circuit 106 samples the output of SSC 102, to
produce a series of random numbers. Configurations of
digitization circuit 106 according to example embodiments
will be described below, with reference to FIGS. 6A and 6B.

As SSC 102 is at starvation, the input-to-output delay of
SSC 102 will have high entropy; thus, digitization circuit
106 will generate a series of random numbers.

The configuration of random number generation circuitry
100 as shown in FIG. 1 and described hereinabove is an
example configuration that is cited purely for conceptual
clarity. Other configurations may be used in alternative
embodiments. For example, in some embodiments a plural-
ity of SSC circuits may be used for the concurrent generation
of more than one random number.

Example SSC-PS Configurations

We next present various embodiments of an SSC-PS
circuit 104 (FIG. 1), that generates the power supply source
of SSC 102 within the starvation range.

Figure 2A:
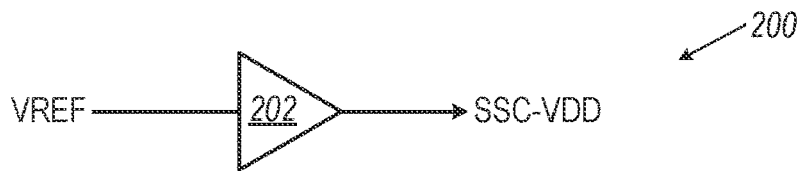
FIG. 2A is a block diagram that schematically illustrates a circuit for generating a starvation operating voltage by buffering an external voltage reference, in accordance with an embodiment of the present invention.

FIG. 2A is a block diagram that schematically illustrates
a circuit 200 for generating a starvation operating voltage by
the buffering of an external voltage reference, in accordance
with an embodiment of the present invention.

The starvation voltage is supplied by an external voltage
reference VREF; in some embodiments VREF may be input
to the integrated circuit from an external voltage reference;
in other embodiments VREF may be generated within the
integrated circuit.

According to the example embodiment illustrated in FIG.
1, VREF is input to a unity-gain amplifier 202, which
produces a low-internal-impedance supply voltage, at the
starvation voltage, to SSC 102.

In some embodiments, the starvation range may vary
between same-type devices due to minute changes in the
electrical parameters. In embodiments, a starvation voltage
may be calibrated—e.g., during device final test. In embodi-
ments, recalibration may be occasionally applied to com-
pensate for device aging.

Figure 2B:
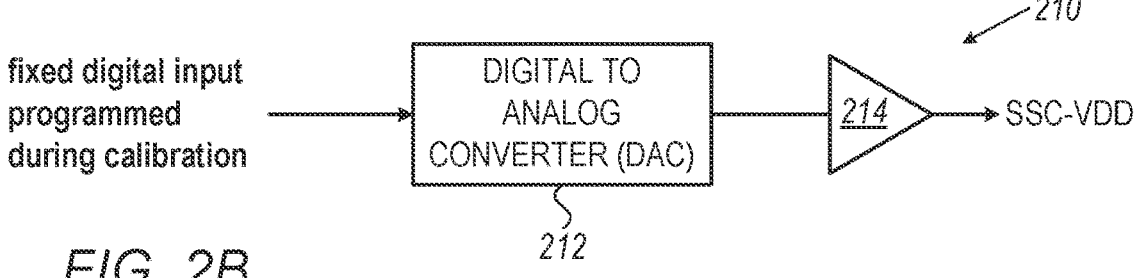
FIG. 2B is a block diagram that schematically illustrates a circuit for generating a starvation operating voltage using calibration, in accordance with an embodiment of the present invention.

FIG. 2B is a block diagram that schematically illustrates
a circuit 210 for generating a starvation operating voltage
using calibration, in accordance with an embodiment of the
present invention. A digital to analog (DAC) converter 212
converts a digital input to an analog voltage; a unity-gain
buffer 214 then produces a low-internal-impedance supply
voltage, at the starvation voltage, to SSC 102 (FIG. 1).

The digital input to DAC 212 may be set during calibra-
tion to generate an output voltage within the starvation
range. In some embodiments, the calibration is done by
programming a group of fuses. In other embodiments the
calibration is done by programming a non-volatile memory.
In an embodiment, DAC 212 produces a voltage that is the
sum of a fixed bias and the conversion to analog of the
digital inputs (this may increase accuracy and/or allow usage
of low-resolution DAC). In some embodiments, DAC 212
comprises an analog selector, which is configured to select
one of a plurality of input voltage references, e.g., outputs of
a resistor ladder.

Figure 2C:
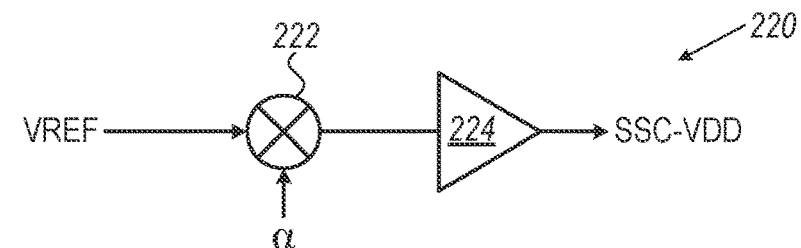
FIG. 2C is a block diagram that schematically illustrates a circuit for generating a starvation operating voltage by multiplying an external voltage reference, in accordance with an embodiment of the present invention.

FIG. 2C is a block diagram that schematically illustrates
a circuit 220 for generating a starvation operating voltage by
multiplying an external voltage reference, in accordance
with an embodiment of the present invention. An input
reference voltage (from a source within or outside the
integrated circuit) is input to an analog multiplier 234 that
multiplies VREF by a constant α. The analog multiplier may
be, for example, a resistor-ladder, or by an operational
amplifier. A unity-gain buffer 224 then produces a low-
internal-impedance starvation supply voltage to SSC 102
(FIG. 1).

The main contributor to starvation voltage variations is
typically the variation in the transistor's threshold voltage—
Vth. In embodiments, such variations may be mitigated by
producing a starvation voltage that reflects the actual Vth.

Figure 2D:
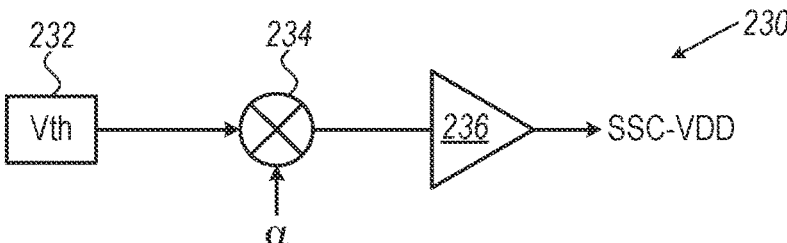
FIG. 2D is a block diagram that schematically illustrates a circuit for generating a starvation operating voltage by multiplying a threshold voltage, in accordance with an embodiment of the present invention.

FIG. 2D is a block diagram that schematically illustrates
a circuit 230 for generating a starvation operating voltage by
multiplying a threshold voltage, in accordance with an
embodiment of the present invention. A Vth circuit 232
outputs a reference voltage that is equal to the threshold of
transistors in the integrated circuit. Vth circuit 232 may be,
for example, a reference transistor that conducts a reference
current, with its gate connected to its source. In embodi-
ments, the reference transistor is identical to transistors of
SSC 102.

According to the example embodiment illustrated in FIG.
2D, an analog multiplier 234 multiplies the voltage output of
Vth circuit 232 by a constant α (analog multiplier 234 may
be similar or identical to analog multiplier 222, FIG. 2C). A unity-gain buffer 236 then produces a low-internal-impedance starvation supply voltage to SSC 102 (FIG. 1).

Figure 2E:
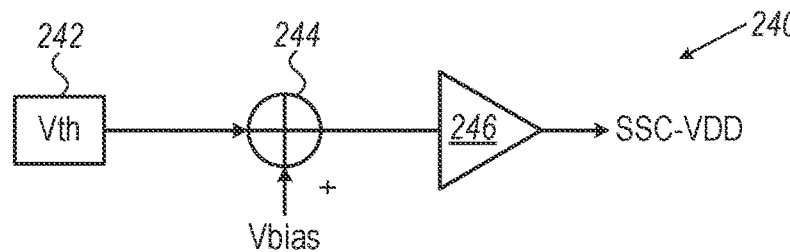
FIG. 2E is a block diagram that schematically illustrates a circuit for generating a starvation operating voltage by biasing a transistor threshold voltage, in accordance with an embodiment of the present invention.

In some embodiments, a bias voltage should be added to Vth, to produce the starvation voltage. FIG. 2E is a block diagram that schematically illustrates a circuit 240 for generating a starvation operating voltage by biasing a transistor threshold voltage, in accordance with an embodiment of the present invention. A Vth cell 242 (similar or identical to Vth cell 232, FIG. 2D) outputs a reference voltage that is equal to the threshold of transistors in the integrated circuit. An analog adder 244 adds a bias voltage Vbias to the output of Vth cell 242, and a unity-gain buffer 246 outputs a low-internal-impedance starvation supply voltage that is equal to Vth+Vbias, to SSC 102 (FIG. 1).

In some embodiments, the multiplication by constant and the addition of biases in circuits 220, 230 and 240 (FIGS. 2C, 2D, and 2E) can be done using one or more operational amplifiers; see, for example, "Designing Gain and Offset in Thirty Seconds", Texas Instruments Application Report SLOA097, February 2002.

The configurations of circuits 200, 210, 220, 230 and 240, illustrated in FIGS. 2A through 2E and described hereinabove are examples that are cited merely for the sake of conceptual clarity. Other circuits that produce a starvation-voltage power supply may be used in alternative embodiments. For example, a Vth-based circuit may be fine-tuned during calibration. For another example, a Vth may be both multiplied by a constant and summed with a bias voltage. In an embodiment, a starvation voltage power supply is indirectly controlled, e.g., by adjusting a frequency of an oscillator SSC (an example embodiment of this technique will be described with reference to FIG. 4).

Example SSC Configurations

We next present various embodiments of SSC circuit 102 (FIG. 1).

Figures 3, 4:
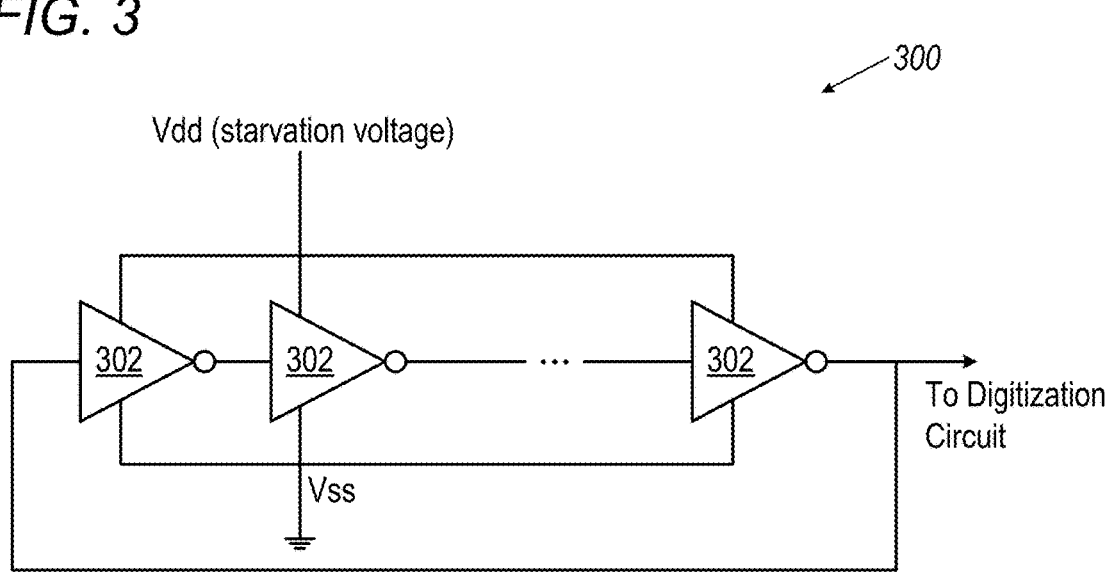
FIG. 3 is a block diagram that schematically illustrates a ring oscillator signal-source circuit (SSC), in accordance with an embodiment of the present invention.
FIG. 4 is a block diagram that schematically illustrates circuitry for random number generation in an integrated circuit, wherein the SSC is a ring-oscillator, and wherein the operating voltage is indirectly set by controlling the oscillator frequency, in accordance with an embodiment of the present invention.

FIG. 3 is a block diagram that schematically illustrates a ring oscillator SSC 300, in accordance with an embodiment of the present invention. The ring oscillator comprises an odd number of daisy-chained inverters 302, with the output of the last inverter connected to the input of the first inverter. Inverters 302 share a negative (Vss) and a positive (Vdd) power-supply ports; the positive power supply port is set to the starvation voltage by an SSC power supply circuit 104 (FIG. 1; not shown).

The configuration of ring oscillator 300, illustrated in FIG. 3 and described above is cited by way of example. Other configurations may be used in alternative embodiments. For example, in some embodiments, one or more of inverters 302 may be replaced by a gate (e.g., a NOR gate), to facilitate a turn-off input for the oscillator (e.g., to save power when random number generation is not needed).

In some embodiment, circuit 100 (FIG. 1) is configured to set the voltage level of the SSC power input in the starvation range indirectly. For example, the oscillation frequency of ring-oscillators is typically a function of the power supply voltage; the starvation range of the ring oscillator power supply corresponds, therefore, to a range of oscillation frequencies.

FIG. 4 is a block diagram that schematically illustrates circuitry 400 for random number generation in an integrated circuit, wherein the SSC is a ring-oscillator, and wherein the operating voltage is indirectly set by controlling the oscillator frequency, in accordance with an embodiment of the present invention. Circuitry 400 comprises a ring-oscillator SSC 300 (FIG. 3) and an SSC power supply 402, which, in turn, comprises a Pulse circuit 404, a transistor 406 and a capacitor 408. The output of ring oscillator 300 is coupled to a pulse circuit 404, which outputs a fixed-width pulse in response to transitions in the outputs of the ring oscillator.

According to the example embodiment illustrated in FIG. 4, transistor 406 is a P-type transistor that stops conducting when pulse circuit 404 outputs a pulse (in alternative embodiments, the pulse is negative and transistor 406 is an n-type transistor). Thus, when the frequency of the ring oscillator increases, the duty cycle of the pulses that pulse circuit 404 generates increases, the conduction time of transistor 406 decreases and the Vdd voltage decreases. This negative feedback configuration adjusts the frequency to a preset value, which corresponds to Vdd at the starvation voltage.

The configuration of circuit 400, illustrated in FIG. 4 and described hereinabove is an example that is cited merely for the sake of conceptual clarity. Other configurations may be used in alternative embodiments. For example, in an embodiment, circuit 402 controls the voltage level at the drain (rather than the source) of transistor 406 (in which case transistor 406 is an NMOS transistor). In some embodiments transistor 406 may be bipolar.

Figure 5:
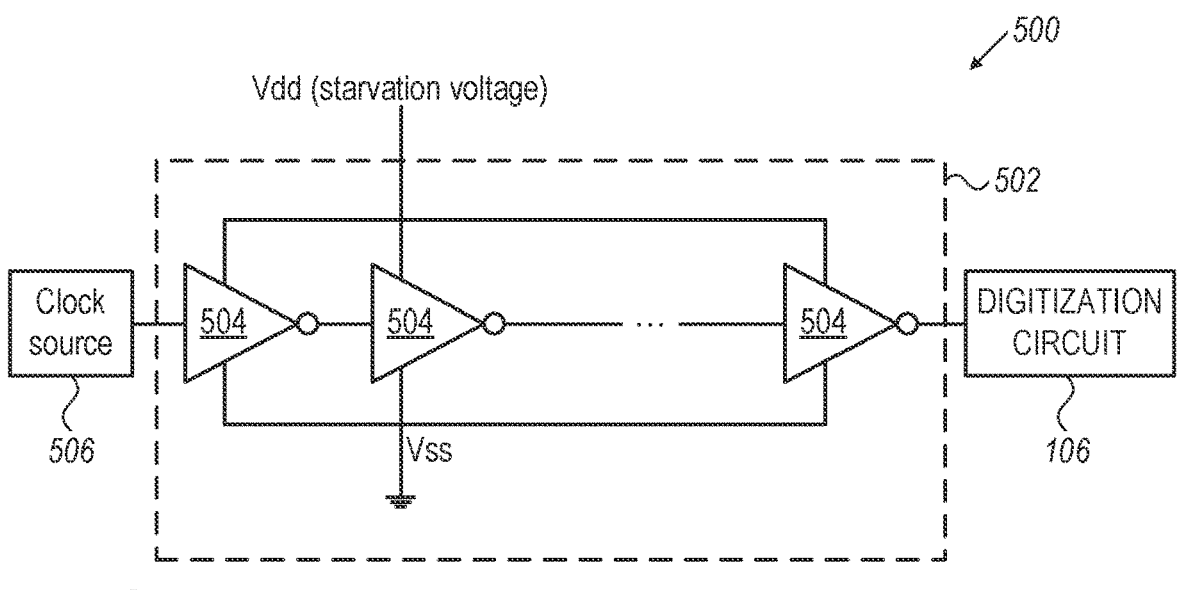
FIG. 5 is a block diagram that schematically illustrates circuitry for random number generation in an integrated

FIG. 5 is a block diagram that schematically illustrates circuitry for random number generation in an integrated circuit, wherein the SSC is a multi-stage buffer, in accordance with an embodiment of the present invention. A multi-stage-buffer-type SSC 502 comprises a plurality of cascaded inverters 504. The input of the first inverter is connected to a clock source 506, and the output of the last inverter is connected to a digitization circuit 106. The operating voltage of SSC 502 is within the starvation range.

Since inverters 504 operate at a starvation voltage supply, the propagation delay within SSC 102 comprises a large random component and varies with large entropy. Therefore, digitization circuit 106, which samples the output of SSC 502, receives a series of ones and zeros which may be considered random. In an embodiment, digitization circuit 106 samples the output of SSC 502 with the same clock source 506.

To further increase the entropy, the minimum accumulated delay of inverted 504 is considerably larger than the cycle time of clock source 506.

In summary, according to the example embodiment illustrated in FIG. 5 and described hereinabove, a buffer that comprises multiple inverters operating at the starvation voltage delays a clock source by a random time. Digitization circuit 106 is configured to sample the delayed clock source, producing a series of ones and zeroes; the series may be considered random.

Example Digitization Circuit Configurations

FIG. 6A is a block diagram that schematically illustrates circuitry for random number generation wherein the digitization circuit samples the SSC output responsively to edges in a clock source, in accordance with an embodiment of the present invention. An SSC 102 (e.g., a ring oscillator 300, or a multi-stage buffer 502 that is connected to a clock source), with a power supply at the starvation voltage, outputs an oscillating signal to a digitization circuit 106. The digitization circuit comprises a sampler 600, and the SSC output signal is connected to the clock input of the sampler. The D input of the sampler is connected to a reference frequency source. Since the delays of the inverters in the ring oscillator at starvation vary (due to the high noise in the inverters), sampler 600 will randomly sample a logic-zero or a logic-one.

To mitigate metastability, sampler 600 may comprise two or more daisy-chained D-type flip-flops.

FIG. 6B is a block diagram that schematically illustrates circuitry for random number generation wherein the digitization circuit samples a reference clock or a counter that is clocked by a reference clock, responsively to edges in the SSC output, in accordance with an embodiment of the present invention. SSC 102 (e.g., a ring oscillator 300, or a multi-stage buffer 502 that is connected to a clock source), with a power supply at the starvation voltage, outputs an oscillating signal to digitization circuit 106. The digitization circuit comprises a sampler 650, which samples the SSC output signal responsive to edges in a clock input of the sampler. Since the delays of the inverters in the ring oscillator vary (due to the high noise in the inverters), sampler 650 will sample a logic-zero or a logic-one in a series that may be considered random.

The configurations of digitization circuit 106, illustrated in FIGS. 6A and 6B, are cited by way of example. Other configurations may be used in alternative embodiments. For example, in some embodiments, digitization circuit 106 comprises a T-type flip-flop that toggles if the SSC output is at logic one when the clock input toggles.

RNG Method Description

FIG. 7 is a flowchart 700 that schematically illustrates a method for generating random numbers in an integrated circuit, in accordance with an embodiment of the present invention. The flowchart is executed by random-number-generator circuitry 100 (FIG. 1).

The flowchart starts at a set-Vdd-at-starvation stage 702, wherein an SSC-PS 104 circuit (FIG. 1) sets the power supply voltage of an SSC circuit 102 to a starvation voltage, which is below the minimum operating voltage range that guarantees that the electrical parameters of the SSC will meet predefined specifications, and yet above the voltage that guarantees functionality. As explained above, when working at this voltage level, the SSC is noisy, and exhibit delays with large random component.

Next, at a check-random-number-request stage 704, the random number generation circuitry waits until a random number is needed (for example, request by a processor). If a random number is requested, the random-number-generator circuitry, in a wait-time-interval stage 706, waits for a preset time interval and then, in a sample-random-bit stage 708, samples the output of the SSC. Due to the noisy operation of SSC 102 at the starvation voltage, the logic level of the SSC after an uncorrelated time interval is expected to be random. In some embodiments, the random-number generator, in step 704, uses the SSC output edges to sample a fast-toggling clock or a counter.

At a check-last-bit stage 710, the random number generation circuitry checks if all bits of the random number were sampled; if more bits are needed, the random number generation circuitry returns to step 706 to sample the next bit. When the complete number has been sampled (e.g., after 32 iterations of stages 706 and 708 for 32-bit random numbers), the random number generation circuit reenters stage 704 to wait for the next random number generation request.

The configuration of flowchart 700 illustrated in FIG. 7 and described above is cited by way of example. Other configurations may be used in alternative embodiments. For example, wait stage 706 may be skipped if the sampling frequency is significantly lower than the SSC frequency.

Multiple SSCS

Embodiments according to the present invention are not limited to a single SSC. In some embodiments, a plurality of SSCs, sampled by one or more digitization circuits, are used. The outputs of the digitization circuits may be combined to a single random output using, for example an exclusive-or (xor) function of the digitization circuits. Such arrangement may, in some embodiments, further increase the entropy of the generated random numbers.

The configurations of random number generation circuit 100, including SSC 102, SSC-PS 104, digitization circuit 106, and flowchart 700, as shown in FIGS. 1 through 7, and described herein are example configurations and flowchart that are shown purely for the sake of conceptual clarity. Any other suitable system configurations and flowcharts can be used in alternative embodiments. The different elements of random number generation circuit 100 may be implemented using suitable software, using hardware, or using a combination of hardware and software elements.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An integrated circuit, comprising:
   signal-source circuitry (SSC), configured to generate an output signal, which is guaranteed to meet specified electrical parameters provided that a supply voltage to the SSC is within a specified operating voltage range;
   an SSC power supply circuit (SSC-PS), configured to power the SSC with a starvation voltage that is constantly below the specified operating voltage range, thereby causing the output signal to be noisy, the SSC-PS comprising a negative-feedback circuit that controls the starvation voltage in an inverse relation to a frequency of the output signal; and
   a digitation circuit, configured to digitize the noisy output signal so as to generate a sequence of random numbers.

2. The integrated circuit according to claim 1, wherein the SSC-PS is configured to set the starvation voltage to constantly meet a specified logical functionality of the SSC, but to constantly fail meeting one or more electrical parameter specifications of the SSC.

3. The integrated circuit according to claim 1, wherein the SSC-PS is configured to calibrate the starvation voltage.

4. The integrated circuit according to claim 1, wherein the SSC is an oscillator.

5. The integrated circuit according to claim 1, wherein the SSC comprises a chain of at least two buffers.

6. The integrated circuit according to claim 1, wherein the SSC is implemented using one or more logic cells that are from a digital library of basic logic cells, and wherein the starvation voltage is below the operating voltage range specified for the basic logic cells of the library.

7. The integrated circuit according to claim 1, wherein the negative-feedback circuit comprises:

a pulse circuit, configured to generate pulses in response to transitions in the output signal; and a transistor, configured to be gated by the pulses and to control the starvation voltage.

8. A method, comprising:

using signal-source circuitry (SSC), generating an output signal, which is guaranteed to meet specified electrical parameters provided that a supply voltage to the SSC is within a specified operating voltage range;

powering the SSC with a starvation voltage that is constantly below the specified operating voltage range, thereby causing the output signal to be noisy;

controlling the starvation voltage in an inverse relation to a frequency of the output signal; and digitizing the noisy output signal so as to generate a sequence of random numbers.

9. The method according to claim 8, wherein powering the SSC comprises setting the starvation voltage to constantly meet a specified logical functionality of the SSC, but to constantly fail meeting one or more electrical parameter specifications of the SSC.

10. The method according to claim 8, wherein powering the SSC comprises calibrating the starvation voltage.

11. The method according to claim 8, wherein the SSC is an oscillator.

12. The method according to claim 8, wherein the SSC comprises a chain of at least two buffers.

13. The method according to claim 8, wherein the SSC is implemented using one or more logic cells that are from a digital library of basic logic cells, and wherein the starvation voltage is below the operating voltage range specified for the basic logic cells of the library.

14. The method according to claim 8, wherein controlling the starvation voltage comprises:

generating pulses in response to transitions in the output signal; and controlling the starvation voltage responsively to the pulses.

* * * * *